(12) United States Patent
Slaughter

(10) Patent No.: US 7,867,696 B2
(45) Date of Patent: Jan. 11, 2011

(54) METHOD AND APPARATUS FOR MONITORING SATURATION LEVELS OF SOLVENTS USED DURING RAPID PROTOTYPING PROCESSES

(75) Inventor: Victor Blakemore Slaughter, Manchester, MO (US)

(73) Assignee: The Boeing Company, Chicago, IL (US)

( * ) Notice: Subject to any disclaimer, the term of this patent is extended or adjusted under 35 U.S.C. 154(b) by 948 days.

(21) Appl. No.: 10/825,388

(22) Filed: Apr. 15, 2004

(65) Prior Publication Data

US 2005/0233261 A1 Oct. 20, 2005

(51) Int. Cl.
*B08B 3/08* (2006.01)

(52) U.S. Cl. .................. 430/322; 430/330; 430/329; 436/55; 134/40; 134/38; 134/105

(58) Field of Classification Search ............ None
See application file for complete search history.

(56) References Cited

U.S. PATENT DOCUMENTS

| | | | | |
|---|---|---|---|---|
| 4,015,986 | A | * | 4/1977 | Paal et al. .............. 430/323 |
| 5,670,376 | A | * | 9/1997 | Obeng .................. 436/55 |
| 6,368,421 | B1 | * | 4/2002 | Oberlander et al. ......... 134/40 |
| 2002/0197869 | A1 | * | 12/2002 | Nakagawa et al. ........ 438/689 |
| 2004/0160225 | A1 | * | 8/2004 | Kung ................. 324/447 |

* cited by examiner

*Primary Examiner*—Daborah Chacko Davis
(74) *Attorney, Agent, or Firm*—Harness, Dickey & Pierce, P.L.C.

(57) ABSTRACT

A monitoring device and method is disclosed for monitoring the saturation level of resin in solvent baths, such as those used to remove resin from objects form by stereolithography. The monitoring device operates by monitoring an electrical characteristic, such as impedance, of the solvent bath as the resin-to-solvent ratio of the bath increases during use. Signals are provided by the monitoring device to the operator of the liquid storage device containing the solvent bath in a manner allowing the operator to determine when the solvent bath has reached the end of its useful life.

15 Claims, 3 Drawing Sheets

METHOD AND APPARATUS FOR MONITORING SATURATION LEVELS OF SOLVENTS USED DURING RAPID PROTOTYPING PROCESSES

FIELD

The present disclosure pertains to the field of monitoring saturation levels of dissolved solutes in solvent solutions. More particularly, this invention pertains to the use of electrical characteristics of such solutions to determine and monitor saturation levels.

BACKGROUND

During some rapid prototyping processes, such as stereolithography, it is common to perform a step removing uncured and partially-cured residual resin from formed objects using a solvent such as Tripropylene Glycol Methyl Ether, which is also referred to as Glycol Ether TPM, or just TPM. This step is typically performed to remove uncured resin that coats an object after the object has been formed and to remove undesired partially-cured resin therefrom, prior to performing an additional step of "baking" the part with ultraviolet light to fully cure all resin remaining in the part.

Typically, the step of removing resin from objects comprises submersing the formed objects in a bath of solvent for a period of time. During this step, an agitator is often provided in the bath of solvent to create relative movement between the objects and the solvent.

As the bath of solvent is utilized to remove resin from objects, the concentration level of dissolved resin in the solvent bath increases. Eventually, the solvent becomes fully saturated with dissolved resin, and thereby becomes ineffective in removing further resin from objects. Once it is determined that solvent has become saturated, the bath of solvent is typically fully or partially drained, and then resupplied with fresh solvent.

Determining when a bath of solvent has become saturated or predicting how soon such a bath of solvent will become saturated has been difficult. Resort is often made to empirical data as a guide for determining when to service a bath solvent. However, such data is often inaccurate or unreliable and, as a result, solvent is often stocked in reserve. Additionally, the unpredictable timing of the solvent's saturation results in unexpected service delays that increase production periods and disrupt schedules associated with the production of resin cured objects.

SUMMARY

The present disclosure eliminates many of the difficulties associated with prior art techniques of determining when a bath of solvent has become saturated or predicting how soon such a bath of solvent will become saturated. In general, the disclosure allows for the constant monitoring of the saturation level of resin in solvent baths.

In one aspect of the disclosure, a method comprises forming at least a portion of an object by curing resin. This method further comprises the step of providing a storage device containing a liquid. The liquid comprises a solution of solvent and dissolved resin, such that the solution has a ratio of the dissolved resin to solvent. Additionally, the method comprises the step removing an amount of resin from the object via the liquid in a manner such that the amount of resin becomes dissolved in the liquid and thereby increases the ratio of the dissolved resin to the solvent of the liquid. The increase of the ratio alters an electrical characteristic of the liquid. The method yet further comprises the step of utilizing changes in the electrical characteristic of the liquid as an indicator of the ratio of the dissolved resin to the solvent of the liquid.

In another aspect of the disclosure, a method comprises forming at least a portion of an object by curing resin. This method also comprises the step of providing a storage device containing a liquid. The liquid comprises solvent and dissolved resin, and has at least one electrical characteristic. Additionally, the method comprises removing an amount of resin from the object via the liquid in a manner such that the amount of resin becomes dissolved in the liquid and thereby alters the electrical characteristic of the liquid. Furthermore, the method comprises removing an amount of the liquid from the storage device and adding solvent to the liquid in the storage device in response to a measurement of the electrical characteristic of the liquid. The solvent added to the liquid in the storage device thereby alters the electrical characteristic of the liquid. Furthermore, the method comprises removing an amount of the liquid from the storage device and adding solvent to the liquid in the storage device in response to a measurement of the electrical characteristic of the liquid. The solvent added to the liquid in the storage device thereby alters the electrical characteristic of the liquid in the storage device.

In yet another aspect of the disclosure, a method comprises the step of providing a storage device containing a liquid. The liquid comprises solvent and solute and has a ratio of the solute to the solvent. This method also includes removing an amount of material from an object via the liquid in a manner such that the amount of material becomes additional solute in the liquid and thereby increases the ratio of the solute to the solvent of the liquid. The increase of the ratio alters an electrical characteristic of the liquid. Additionally, the method comprises the step of utilizing changes in the electrical characteristic of the liquid as an indicator of the ratio of the solute to the solvent of the liquid.

In yet another aspect of the disclosure, an assembly comprises a storage device, an amount of liquid stored in the storage device, and a monitoring device. The liquid comprises solvent and dissolved resin. The monitoring device is in communication with the liquid in the storage device and is adapted and configured to pass an electric current through at least some of the liquid and to produce a plurality of signals indicative of a plurality of conditions of conductivity of the liquid in the storage device.

While the principal advantages and features of the disclosure have been described above, a more complete and thorough understanding of the disclosure may be obtained by referring to the drawings and the detailed description of the preferred embodiment, which follow.

Figure 1:
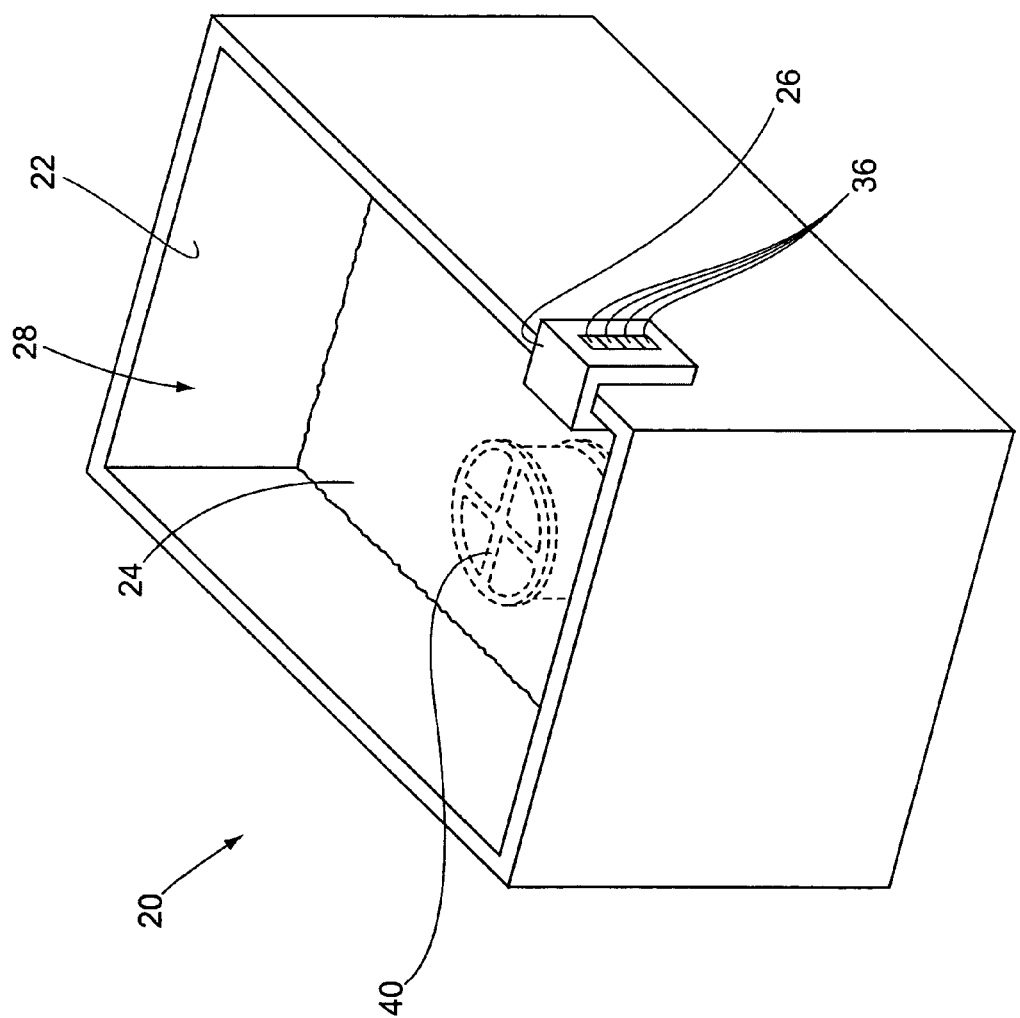
FIG. 1 is a perspective view showing a cleaning apparatus having a liquid storage device for removing resin from objects and a monitoring device for practicing the disclosure.

Reference characters in the written specification indicate corresponding items shown throughout the drawing figures.

DETAILED DESCRIPTION OF THE VARIOUS EMBODIMENTS

In general, the present disclosure involves the monitoring of at least one electrical characteristic of a solvent used to dissolve and remove undesirable resin from objects. An embodiment of a cleaning apparatus for practicing the disclosure is shown in FIG. 1. This cleaning apparatus, generally indicated by reference numeral 20, is particularly adapted for the removal of resin from prototype objects during a process of forming such objects via a stereolithography process. The cleaning apparatus 20 generally comprises a liquid storage device 22 containing a bath of solvent 24, and a monitoring device 26.

The liquid storage device 22 is preferably a commonly available standard liquid storage device of the type typically utilized in connection with most stereolithography techniques. As shown, the storage device 22 has an internal cavity 28 that is open to the environment above the storage device such that objects can be easily inserted into and removed from the cavity. A removable or openable lid or the like (not shown) could also be utilized to selectively close the cavity of the storage device 22 so as to limit evaporation of solvent from the bath of solvent 24. Like most liquid storage devices used for similar purposes, the storage device 22 preferably comprises an agitation device (not shown) which supports the stereolithography objects when such objects are submerged in the bath of solvent 24. The agitation device is also preferably adapted and configured to raise and lower parts into and out of the bath of solvent 24 and to create agitation sufficient to cause relative movement between the solvent and the objects submersed therein. The bath of solvent 24 preferably comprises TPM and, assuming the bath has been already been utilized to remove resin, some amount of dissolved resin.

The monitoring device 26 is preferably configured to be supported by the liquid storage device 22 in a manner such that a portion of the monitoring can be seen from the workplace surrounding the storage device. Another portion of the monitoring device 26 is preferably positioned in a manner such that it is submerged in the bath of solvent 24.

Figure 2:
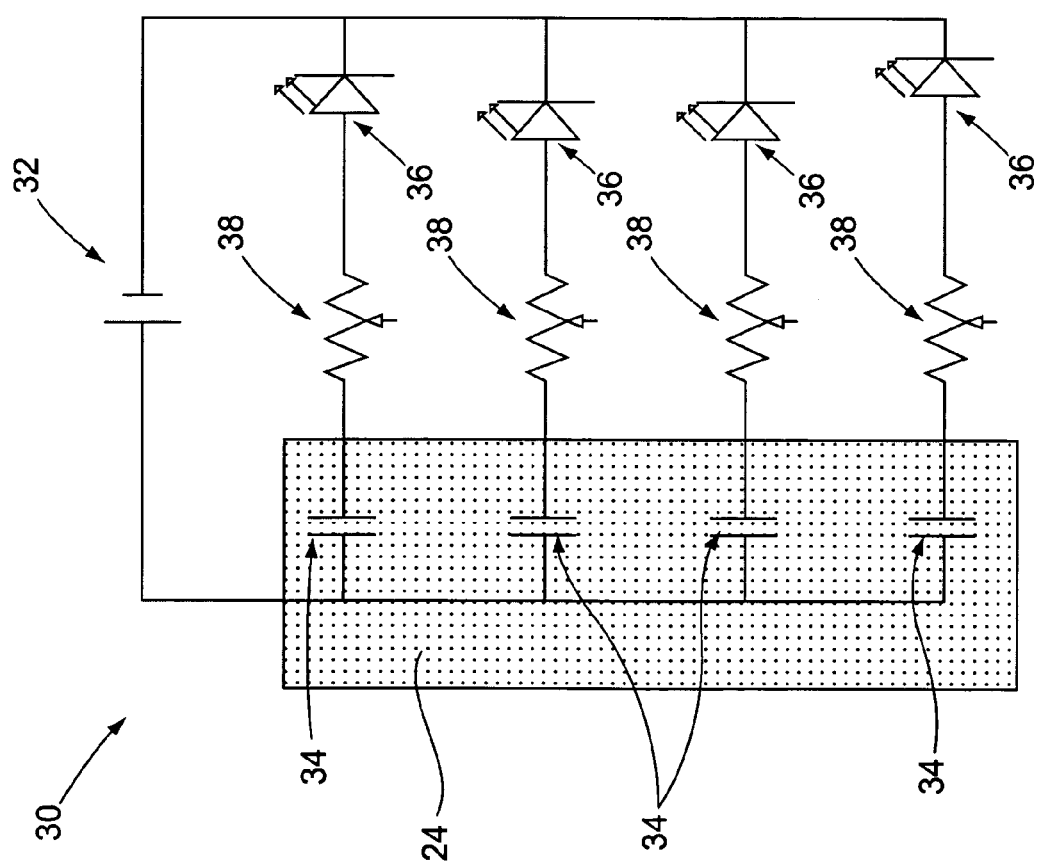
FIG. 2 is a schematic of the electrical circuitry of the preferred embodiment of a monitoring device for practicing the disclosure.

The monitoring device preferably comprises the electrical circuit 30 shown in FIG. 2. The electrical circuit 30 comprises an electrical power source 32, at least one pair of spaced probes 34, a plurality of light-emitting diodes 36, and a plurality of variable resistors 38. The electrical power source 32 is preferably a rechargeable or replaceable battery, but could also be another type of power source such as the power supply of the liquid storage device 22 or any electrical outlet. Each pair of spaced probes 34 is preferably positioned such that it is submerged in the bath of solvent with its probes spaced approximately between ¾ and ⅞ inches apart from each other. Preferably, each one of the variable resistors 38 is connected in series with one of the light-emitting diodes 36 and with one of the pairs of spaced probes 34. Each of such series is also preferably connected in parallel with the power source 32.

In use, the bath of solvent 24 in the liquid storage device 22 of the cleaning apparatus 20 initially has a ratio of dissolved resin-to-solvent (resin-to-solvent concentration ratio) that is at or near zero. An object at least partially formed of resin is then placed into the bath of solvent 24 for purposes of removing partially cured and uncured resin therefrom. FIG. 1 depicts such an object 40 submersed in the bath 24.

With the object 40 submersed in the bath 24, the agitation device creates relative movement between the object 40 and the bath 24 and effectively mixes the bath. Throughout this procedure, the solvent in the bath 24 dissolves and removes some of the resin from the object 40, thereby increasing the resin-to-solvent concentration ratio of the bath. After a desired amount of resin has be removed from the object 40, the object is removed from the liquid storage device 22 of the cleaning apparatus 20 for further processing. It should be appreciated that, typically, many objects can be washed in the liquid storage device 22, individually or in batches, before the solvent becomes saturated, and that as more and more objects are washed in this manner, the resin-to-solvent concentration ratio of the bath 24 increases. Thus, after a sufficient amount of resin has been dissolved in the solvent, the resin-to-solvent concentration ratio of the bath 24 approaches saturation such that the bath can no longer effectively remove resin from objects.

The monitoring device 26 monitors the resin-to-solvent concentration in a manner eliminating the guesswork of determining how close the bath 24 is to needing to be replaced with fresh solvent. To this end, the bath of solvent 24 in which the spaced probes 34 of the monitoring device 26 are submerged creates an electrical pathway between each pair of probes. Each of these pathways has an impedance that is dependent upon the spacing between the respective pair of spaced probes 34, and upon the conductivity of the resin and solvent solution in the bath of solvent 24. The spacing between the probes 34 preferably remains constant. However, the conductivity of the resin and solvent solution in the bath of solvent 24 varies depending upon the resin-to-solvent concentration. In particular, experiments conducted by the inventor generally indicate that the conductivity of the liquid in the solvent bath increases as the resin-to-solvent concentration increases. Thus, as the resin-to-solvent concentration of the bath of solvent 24 increases, the impedance of the electrical pathway between each pair of the spaced probes 34 of the monitoring device 26 decreases. As the impedance between a given pair of the spaced probes 34 decreases, the total resistance of the electrical pathway formed by the pair of probes and its respective resistor 38 and LED 36 decreases. Thus, it should be appreciated that when the impedance across each pair of probes 34 drops below a particular value, the voltage across the LED 38 that is connected in series therewith will increase to a point sufficient to illuminate the LED. Moreover, each of the LEDs 36 can be independently configured to illuminate when the impedance of the solution drops below a particular set-point by adjusting the resistance of its respective variable resistor 38.

Figure 3:
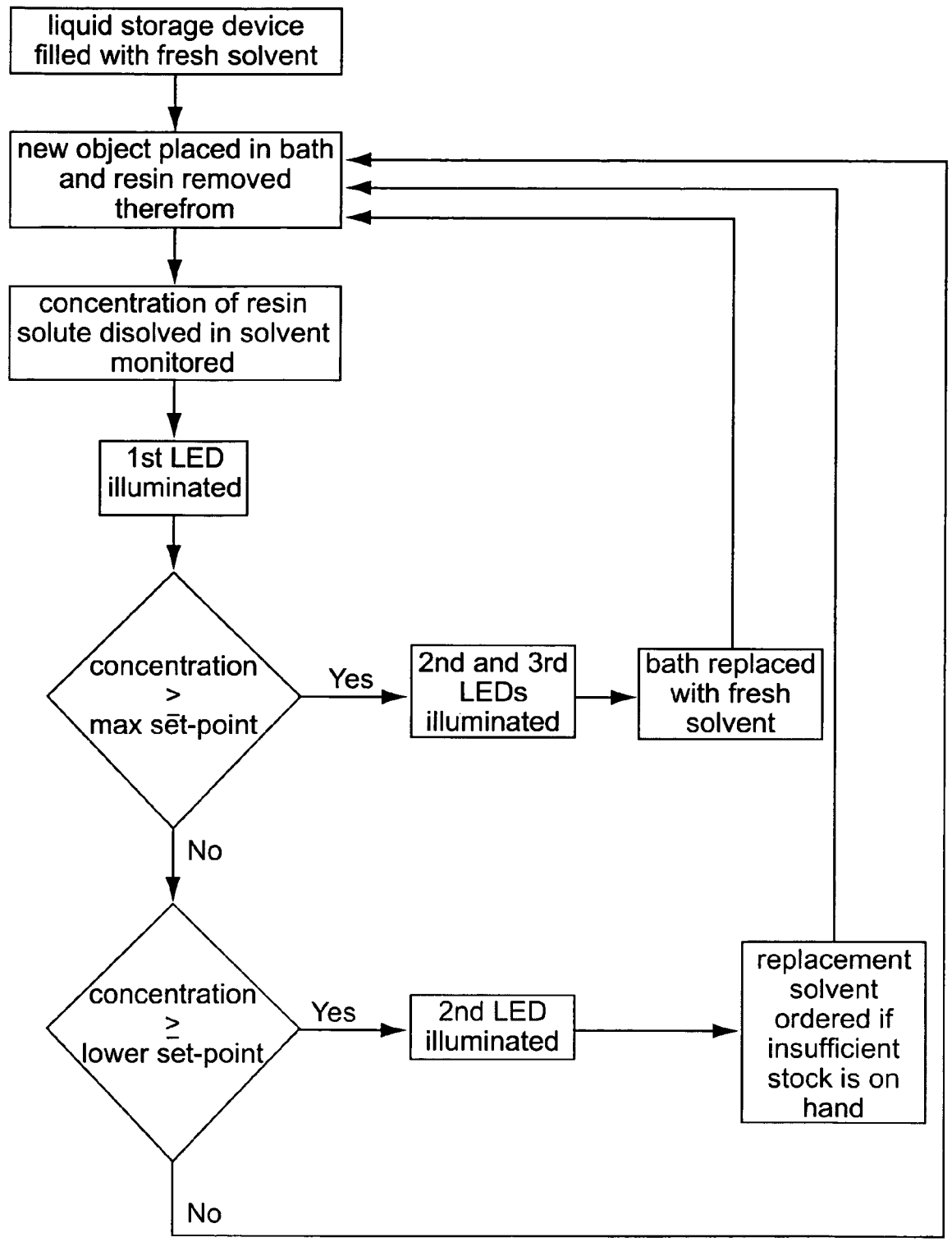
FIG. 3 is a flowchart of the preferred method of practicing the disclosure.

A flowchart of an operation of the cleaning apparatus in connection with the monitoring device is shown in FIG. 3. As resin is removed from objects placed in the liquid storage device, the monitoring device continuously monitors the bath of solvent as described above. Preferably, the variable resistor that is connected in series with a first one of the LEDs is adjusted so that this first LED illuminates even when the solvent bath contains no resin. In other words, the first LED illuminates under all impedance conditions of the bath of solvent. This is done so as to verify to the person using the cleaning apparatus that the monitoring device is functioning. Additionally, the variable resistor that is connected in series with a second one of the LEDs is preferably adjusted such that the second LED illuminates when the resin-to-solvent concentration is above particular value determined to be when the bath of solvent is reaching the end of its usefulness, but prior to when the bath of solvent is needed to be replaced. Furthermore, the variable resistor that is connected in series to yet a third one of the LEDs is preferably adjusted such that this third LED will illuminate only when the impedance of the bath of solvent drops below a value indicative of the need to replace the bath of solvent with fresh solvent. If so desired, additional LEDs can be configured to illuminate when the impedance of the bath of solvent drops below any other impedance set-point. These set-points are preferably determined by trial and error, or by adjusting a resistor to illuminate an LED when the bath of solvent is known to be at the relevant resin-to-solvent concentration level.

In view of the foregoing, it should be appreciated that, as the resin-to-solvent concentration increases, the number of illuminated LED's increases. Thus, an operator using the cleaning apparatus is continually informed of the condition of the bath of solvent. Moreover, the illumination of an LED, such the second LED described above, can serve the purpose of notifying an operator of the cleaning apparatus that the bath of solvent, while still being effective in removing resin, will soon need replacing. Thus, upon the illumination of such an LED, the operator can take steps to ensure that a sufficient stock of solvent will be on hand when the bath of solvent reaches the end of its useful life. The illumination of yet other LEDs can serve as an indication that the resin-to-solvent concentration is sufficiently high to warrant increasing the cleaning time of objects. Hence, practicing the present disclosure allows for, among other things, more efficient scheduling of solution changes, more efficient stocking of solvent, and more efficient overall productivity of the cleaning apparatus.

While the present disclosure has been described in reference to various embodiments, in light of the foregoing, it should be understood that all matter contained in the above description or shown in the accompanying drawings is intended to be interpreted as illustrative and not in a limiting sense and that various modifications and variations of the disclosure may be constructed without departing from the scope of the disclosure defined by the following claims. For example, it should be appreciated that monitoring devices could be configured to only periodically monitor the bath of solvent or to do so only upon a request signal initiated by the operator. Furthermore, in lieu of LEDs, monitoring devices could be configured to use acoustic signals, text messages, or any other method of conveying the status of the bath of solvent. Additionally, the circuitry of the monitoring device need not necessarily be similar to the monitoring device of the preferred embodiment. For example, a monitoring device could have fewer components, such as only a single pair of space probes, or could have additional components, such as Zener diodes to protect the LEDs. Still further, although the disclosure is described as being used in connection with stereolithography, it should be appreciated that it could also being utilized in connection with other rapid prototyping processes or with any process utilizing solvents. Thus, other possible variations and modifications should be appreciated.

Furthermore, it should be understood that when introducing elements of the present disclosure in the claims or in the above description of the embodiments of the disclosure, the terms "comprising," "including," and "having" are intended to be open-ended and mean that there may be additional elements other than the listed elements. Similarly, the term "portion" should be construed as meaning some or all of the item or element that it qualifies.

What is claimed is:

1. A method comprising:
   forming at least a portion of an object by curing resin;
   providing a storage device containing a liquid, the liquid comprising solvent and dissolved resin, the liquid having a ratio of the dissolved resin to the solvent;
   removing an amount of resin from the object by submersing the object in the liquid in the storage device in a manner such that the amount of resin becomes dissolved in the liquid and thereby increases the ratio of the dissolved resin to the solvent of the liquid, the increase of the ratio altering an electrical characteristic of the liquid;
   utilizing changes in the electrical characteristic of the liquid as an indicator of the ratio of the dissolved resin to the solvent of the liquid; and
   using said changes in the electrical characteristic of the liquid to drive a visual display that is able to provide a plurality of different indications as to said ratio.

2. The method in accordance with claim 1, wherein the curing of the resin in the step of forming at least the portion of the object occurs via a laser.

3. The method in accordance with claim 1, wherein the electrical characteristic is a conductivity of the liquid.

4. The method in accordance with claim 1, wherein the solvent recited in the steps is Tripropylene Glycol Methyl Ether.

5. The method in accordance with claim 1, wherein utilizing changes in the electrical characteristic of the liquid as an indicator of the ratio of the dissolved resin to the solvent of the liquid is performed to determine whether the ratio exceeds a desired range, and wherein the method further comprises removing at least some of the liquid from the storage device and adding solvent to the storage device after determining that the ratio exceeds the desired range.

6. The method in accordance with claim 5, wherein the electrical characteristic recited is a conductivity of the liquid.

7. The method in accordance with claim 1, wherein utilizing said changes in the electrical characteristic of the liquid drive a display comprises visually indicating different ranges of the ratio via illumination and non-illumination of at least one light-emitting diode.

8. The method in accordance with claim 7, wherein utilizing changes in the electrical characteristic of the liquid as an indicator of the ratio of the dissolved resin to the solvent of the liquid comprises visually indicating at least three different ranges of the ratio via illumination and non-illumination of at least two light-emitting diodes.

9. A method comprising:
   forming at least a portion of an object by curing resin;
   providing a storage device containing a liquid, the liquid comprising solvent and dissolved resin, the liquid having at least one electrical characteristic;
   removing an amount of resin from the object by submersing the object in the liquid in the storage device such that the amount of resin becomes dissolved in the liquid and thereby alters the electrical characteristic of the liquid;
   removing an amount of the liquid from the storage device and adding solvent to the storage device in response to a measurement of the electrical characteristic of the liquid, the solvent added to the storage device thereby altering the electrical characteristic of the liquid in the storage device; and
   using said measurement of the electrical characteristic of the liquid to drive a display device that is able to visually indicate a plurality of different conditions of said liquid.

10. The method in accordance with claim 9, wherein the curing of the resin forming at least the portion of the object occurs via a laser.

11. The method in accordance with claim 9, wherein the electrical characteristic in removing the amount of the liquid from the storage device and adding solvent to the storage device is a conductivity of the liquid.

12. The method in accordance with claim 9, wherein visually indicating a plurality of different conditions of said liquid comprises visually indicating different measurement ranges of the electrical characteristic via illumination and non-illumination of at least one light-emitting diode.

13. The method in accordance with claim 12, wherein visually indicating different measurement ranges comprises visually indicating at least three different measurement ranges via illumination and non-illumination of at least two light-emitting diodes.

14. The method in accordance with claim 12, wherein the electrical characteristic removing the amount of the liquid from the storage device and adding solvent to the storage device is a conductivity of the liquid.

15. A method comprising:

forming an object by curing a resin with a laser;

providing a storage device containing a liquid, the liquid comprising solvent and solute, the liquid having a ratio of the solute to the solvent;

removing an amount of material by submersing the object in the liquid in the storage device such that the amount of material becomes additional solute in the liquid and thereby increases the ratio of the solute to the solvent of the liquid, the increase of the ratio altering an electrical characteristic of the liquid, the liquid comprising Tripropylene Glycol Methyl Ether;

utilizing changes in the electrical characteristic of the liquid as an indicator of the ratio of the solute to the solvent of the liquid; and using a plurality of display elements to visually indicate changes in said ratio.

\* \* \* \* \*